United States Patent
Tsang et al.

(10) Patent No.: US 8,242,519 B2
(45) Date of Patent: Aug. 14, 2012

(54) PACKAGE STRUCTURE OF LIGHT EMITTING DIODE FOR BACKLIGHT

(75) Inventors: Jian Shihn Tsang, Taipei County (TW); Wen Liang Tseng, Hsinchu (TW); Yao Te Tseng, Hsinchu County (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 101 days.

(21) Appl. No.: 12/814,943

(22) Filed: Jun. 14, 2010

(65) Prior Publication Data
US 2010/0252842 A1    Oct. 7, 2010

Related U.S. Application Data

(62) Division of application No. 12/117,908, filed on May 9, 2008, now Pat. No. 7,855,390.

(30) Foreign Application Priority Data

Jun. 13, 2007   (CN) .......................... 2007 1 0110879

(51) Int. Cl.
*H01L 33/00* (2010.01)

(52) U.S. Cl. .................... 257/89; 257/99; 257/E33.061
(58) Field of Classification Search .................... 257/89
See application file for complete search history.

(56) References Cited

U.S. PATENT DOCUMENTS 6,496,162 B2 * 12/2002 Kawakami et al. ............. 345/46
2009/0201662 A1 * 8/2009 Kim ................................ 362/84

FOREIGN PATENT DOCUMENTS

JP    2004356116 A   * 12/2004

* cited by examiner

*Primary Examiner* — Thien F Tran
(74) *Attorney, Agent, or Firm* — Altis Law Group, Inc.

(57) ABSTRACT

A package structure of a light emitting diode for a backlight comprises a long-wavelength LED die and a short-wavelength LED die. The lights emitted from the two LED dies are mixed with the light emitted from excited fluorescent powders for serving as the backlight of a liquid crystal display. A partition plate is disposed between the two LED dies for separating them from each other. The effective light output of the package structure is increased because each of the two LED dies cannot absorb the light from the other.

18 Claims, 4 Drawing Sheets

PACKAGE STRUCTURE OF LIGHT EMITTING DIODE FOR BACKLIGHT

CROSS REFERENCE TO RELATED APPLICATIONS

This application is a Divisional application Ser. No. 12/117,908 field May 9, 2008, and is based on and claims priority from P.R.O.C Patent Application No. 200710110879.5 filed Jun. 13, 2007.

BACKGROUND OF THE INVENTION

1. Field of the Invention

The present invention relates to a package structure of a light emitting diode (LED) for a backlight, and more particularly, to a long-wavelength LED for increasing the color rendering index of a backlight.

2. Description of the Related Art

An LED is a semiconductor device, and can serve as a light source with a small volume effectively emitting high-intensity light. Moreover, the light of the LED has a superior mono-color peak in its spectrum. If a white light is generated by LEDs, several color lights emitting from the LEDs need to be mixed. A simple way to get a white light is to simultaneously use red, blue and green LEDs. However, such a white light, a mixture of red, blue and green lights, is disproportionate in its spectrum. A proportionate white light is obtained by mixing various color lights in a complicated optical manner. Furthermore, the brightness of an LED varies with the temperature of the LED semiconductor. That is, the mixed white light changes when the temperature of the LED rises. In addition, the working life of one LED is different from that of another. Accordingly, when one color light LED fails, the change in the mixed light is obvious so that a viewer easily sees an unharmonious light dot. In view of the above, a superior technology for uniformly mixing white light is important.

An existing LED device emits white light that comprises blue light originally generated by an LED mixed with yellow light emitted from fluorescent powders excited by the blue light. However, such a light mixture for the application of a backlight is insufficient in the intensity of red light so that its color rendering index is lower. That is, a viewer is likely to sense that the color shown on the screen lacks red. Therefore, Shimizu et al. put forth a method claimed by U.S. Pat. No. 6,577,073 for generating white light with various color systems by mixing blue light, red light and fluorescent powders. The fluorescence emitted from the excited fluorescent powders has wavelengths ranging between wavelengths of red and blue light. In this regard, the resulting white light is a warm color light. A method for adjusting the white light is to simultaneously tune the wavelength of the blue LED, the intensity of the blue light, the wavelength of the red LED, the intensity of the red light and the spectrum of the fluorescence. However, the adjusting method is too complicated. Furthermore, with regard to the package structure of the LED, the red LED can absorb the blue light so as to reduce the output of the blue light. A backlight using such an LED device appears to the viewer to be weak in the component of the blue light. The efficiency of the integral light output is reduced because the fluorescent powders block the red light.

SUMMARY OF THE INVENTION

An aspect of the present invention is to partition a package structure into two compartments for a long-wavelength LED die and a short-wavelength LED die respectively so that the long-wavelength LED die cannot absorb the light emitted from the short-wavelength LED die. Such a partitioned package structure is implemented by using a substrate with different levels or a partition plate disposed between the long-wavelength and short-wavelength LED dies.

Furthermore, an aspect of the present invention is to partition a package structure into two compartments for a long-wavelength LED die and a short-wavelength LED die respectively so that the light emitted from the long-wavelength LED die cannot be blocked by fluorescent powders and is more efficiently used in the light output of the package structure.

Another aspect of the present invention is to improve the light emitted from a long-wavelength LED die so that the color rendering index of the package structure is increased. An LCD (liquid crystal display) panel using such an LED device can show a larger quantity of colors.

The present invention provides a package structure of an LED for a backlight. The package structure comprises a shell body or housing with a window, a first substrate and a second substrate disposed in the shell body, a first LED die emitting first-wavelength light and a second LED die emitting second-wavelength light. The second-wavelength light and first-wavelength light have different wavelengths. The first substrate and second substrate are located at different physical levels. The first LED die is mounted on the first substrate, and the second LED die is mounted on the second substrate.

The present invention further provides a package structure of an LED for a backlight. The package structure comprises a shell body with a window, a first substrate and a second substrate disposed in the shell body, a first LED die emitting first-wavelength light, a second LED die emitting second-wavelength light and a partition plate disposed between the first substrate and second substrate. The second-wavelength light and first-wavelength light have different wavelengths. The first LED die is mounted on the first substrate, and the second LED die is mounted on the second substrate. The first-wavelength light and second-wavelength light are isolated from each other by the partition plate. A first compartment is confined by the shell body and the partition plate for the first LED die, and a second compartment is confined by the shell body and the partition plate for the second LED die.

Regarding aforesaid embodiments, fluorescent powders and a transparent adhesive material are filled in the shell body or the first compartment, and are mixed well. Alternatively, the fluorescent powders conformably cover one of the first LED die and second LED die which emits light with longer wavelengths. YAG (Yttrium Aluminum Garnet), TAG (Terbium Aluminum Garnet), silicate, sulfate, nitride or nitrogen oxide can be selected as the fluorescent powders. One of the first LED die and second LED die which emits light with shorter wavelengths comprises group III nitride, and the other comprises group III nitride or group III phosphide. The package structure merges two LED dies into one shell body. The LED dies can be in parallel connection or series connection according to different wire bonding manners.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1A:
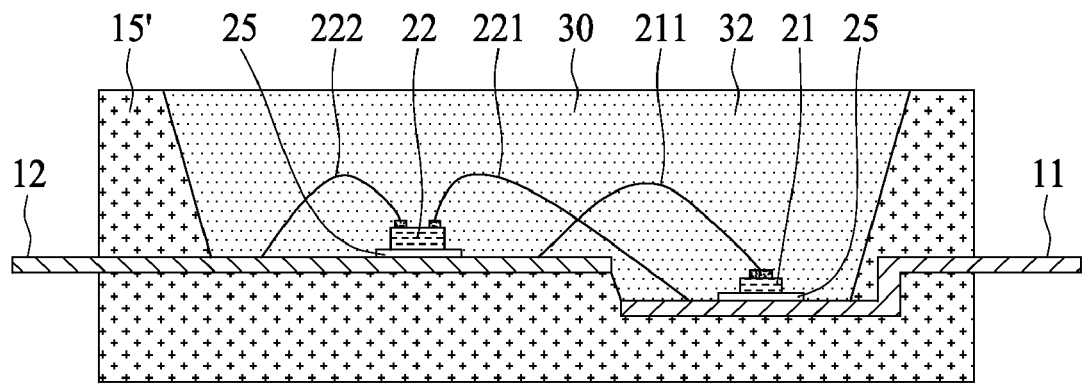
FIGS. 1A and 1B are diagrams showing a down-set package structure of an LED device in accordance with the present invention, wherein LED dies are connected to each other in parallel.

The following will demonstrate the present invention using the accompanying drawings to clearly present the characteristics of the technology.

The present invention provides a package structure comprising two LED dies respectively emitting lights with different wavelengths. Such a package structure is implemented by using a substrate with different levels or a partition plate disposed between the long-wavelength and short-wavelength LED dies so that the long-wavelength LED die cannot absorb the light emitted from the short-wavelength LED die. The lights emitted from the short-wavelength LED die are mixed with the light emitted from excited fluorescent powders in the package structure. In this regard, short wavelength means that the peak wavelength of the light of an LED die ranges from 360 nm to 490 nm. In general, a blue LED die is used as the short-wavelength LED die, and, moreover, a purple LED die or a UV LED die can be used as the short-wavelength LED die. Long wavelength means that the peak wavelength of the light of an LED die ranges from 550 nm to 660 nm. A red, yellow or amber LED die is generally used as the long-wavelength LED die. The spectrum of fluorescence emitted from the excited fluorescent powders ranges from 450 nm to 600 nm. Green or yellow fluorescent powders are commonly used.

The main layer of the long-wavelength LED die is group III nitride or group III phosphide, such as GaP, InGaP, AlGaP, AlInP, AlInGaP, InGaP and AlInGaN. If the group III phosphide is selected, GaAs or InP can act as a substrate for the growth of epitaxial layers. In contrast, if the group III nitride is selected, sapphire, SiC, Si or GaN can act as a substrate. The group III phosphide for the long-wavelength LED die has a longer working life. If the substrate is conductive, electrodes are respectively formed on two opposite surfaces of the long-wavelength LED die. If the substrate is non-conductive, electrodes are respectively formed on the same surface of the long-wavelength LED die. In this embodiment, phosphide with a peak wavelength of 600 nm is preferred.

The main layer of the short-wavelength LED die is group III nitride, such as GaN, InGaN, AlGaN and AlInGaN. The substrate can be sapphire, SiC, Si or GaN. If the substrate is conductive, electrodes are respectively formed on two opposite surfaces of the short-wavelength LED die. If the substrate is non-conductive, electrodes are respectively formed on a surface of the short-wavelength LED die. In this embodiment, phosphide with a peak wavelength of 460 nm is preferred.

The manufacturing processes of the LED comprise a step of growing epitaxy layers in a MOCVD (metal organic chemical vapor deposition) chamber. The conditions of the growth of the epitaxy layers depend on the material of the LED and the spectrum. A single LED die is obtained after the substrate on which the epitaxy layers are formed is cut by scribing.

The package structure can be a top emitting type or a side emitting type, depending upon its application. Furthermore, the package structure can be a pin-through-hole type or an SMD (surface mount device) type depending upon its application. In this embodiment, an SMD package structure is mainly introduced. Regarding package processing, two different LED dies are disposed in a shell body or housing, and fluorescent powders are mixed with molding compound during injection molding or transfer molding. The fluorescent powders and molding compound are mixed in advance, or are covered on an LED die in a conformal layer manner. The material of the shell body can be high-temperature ceramics, low-temperature ceramics, silicon, Alumina or plastic (e.g. PPA). The interconnection between the LED die and substrate can be implemented by wire bonding or flip-chip bonding. Therefore, the package structure can utilize at least one of several bonding methods. The short-wavelength LED die and long-wavelength LED die are electrically connected to the substrate by either wire bonding or flip-chip bonding, or by both wire bonding and flip-chip bonding; for instance, the long-wavelength LED die is electrically connected to the substrate by flip-chip bonding and the short-wavelength LED die is electrically connected to the substrate by wire bonding. In this embodiment, only the wire bonding method is introduced. Regarding the implementation of the wire bonding method, the short-wavelength LED die and long-wavelength LED can be connected to each other in series or in parallel.

Nitride, nitrogen oxide, sulfate, silicate, YAG or TAG can be selected as the fluorescent powders. The Nitride fluorescent powders can be $CaSiN_2:Eu^{2+}$, $Ba_2Si_5N_8:Eu^{2+}$ or $CaSiAlN_3:Eu^{2\pm}$, etc. and the nitrogen oxide fluorescent powders can be $SiAlO_xN_y$. The sulfate fluorescent powders can be $CaS:Eu^{2+}$, CaS.A:Eu or CaS:Ce, X, etc. Furthermore, the fluorescent powder can be silicate series, YAG or TAG, whose main wavelength is between 450 nm and 600 nm. In this embodiment, yellow fluorescent powders are utilized to emit a yellow light mixed with the blue light emitted by a blue LED such that a white light is generated. The yellow fluorescent powders can be nitride, nitrogen oxide, sulfate or silicate, and are produced after being sintered and grounded. Each kind of the aforesaid fluorescent powders is inorganic.

Transparent adhesive can be epoxy and silicone. When we select adequate adhesive, its refraction index, light transmittance, matching with package processes, hardness and mixing requirements with the fluorescent powders shall be considered.

Figure 1B:
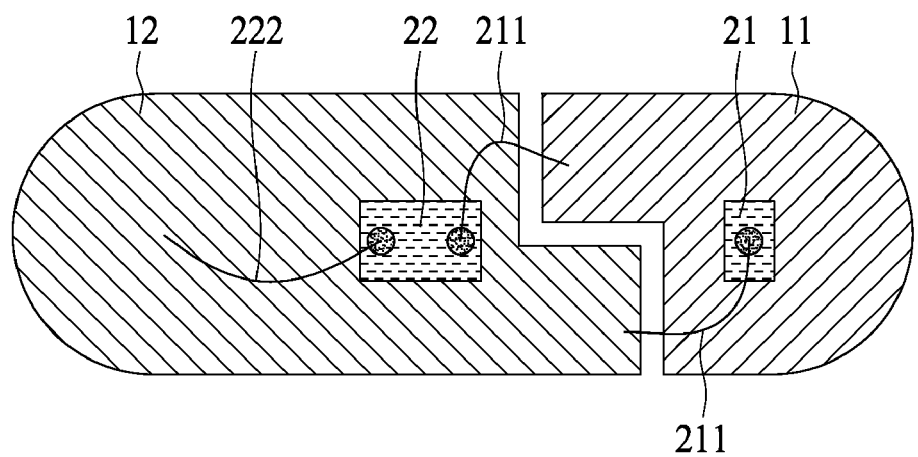
Figure 2A:
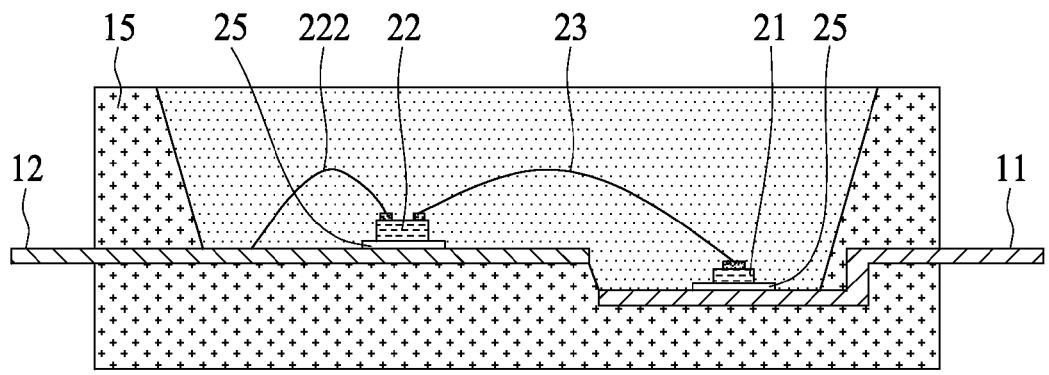
FIGS. 2A and 2B are diagrams showing a down-set package structure of an LED device in accordance with the present invention, wherein LED dies are connected to each other in series.
Figure 2B:
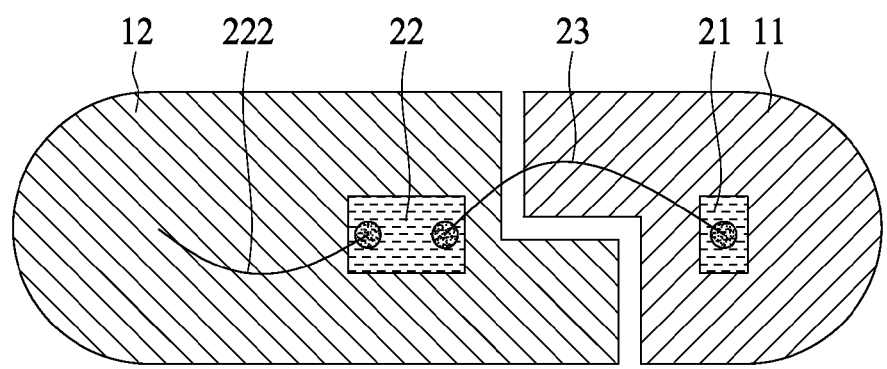

The embodiments of the present invention are further explained by the following descriptions and corresponding drawings. FIGS. 1A-1B are diagrams showing a down-set package structure of an LED device in accordance with the present invention, wherein FIG. 1A is a cross-section diagram of the package structure along a side direction, and FIG. 1B is a cross-section diagram of the package structure along a top direction. A first substrate 11 and a second substrate 12 are disposed in the shell body 15 at different levels. The first substrate 11 and second substrate 12 are conductive materials, and a leadframe is a preferable material. The material of the shell body 15 is a plastic material, such as PPA and PPB, and so the shell body 15 can be mass produced by injection molding. The first substrate 11 has a down-set portion which is formed by a metal pressing process and has a level different from the level of the second substrate 12. If the material of the shell body 15 is ceramics such as high-temperature co-fired ceramics and low-temperature co-fired ceramics, the materials of the first substrate 11 and second substrate 12 can be metal rather than leadframe. Therefore, the shell body 15, first substrate 11 and second substrate 12 can be simultaneously formed by using the high-temperature co-fired ceramics technology or the low-temperature co-fired ceramics technology.

A reflecting layer can be overlaid on the inner walls of the shell body 15 in order to enhance the light output. Alternatively, high-reflective particles such as titania grains can be mixed with the plastic material for the same purpose. The extension portions of the first substrate 11 and second substrate 12 out of the shell body can be bent in several ways to determine that the package structure is a top-emitting type or a side-emitting type.

A first LED die 21 is mounted on the first substrate 11 by a die bonding adhesive 25, and the second LED die 22 is mounted on the second substrate 12 by the die bonding adhesive 25. In this embodiment, the first LED die 21 is a long-wavelength LED die, and is a phosphide LED whose peak wavelength is around 600 nm. Because the first LED die 21 has electrodes disposed on opposite surfaces, a metal wire 211 is needed to connect to the second substrate 12. In this embodiment, the second LED die 22 is a short-wavelength LED die, and is a nitride LED whose peak wavelength is around 460 nm. Because the second LED die 22 has electrodes disposed on the same surface, a positive metal wire 222 is needed to couple to the second substrate 12 and a negative metal wire 221 is needed to couple to the first substrate 11.

In FIG. 1A, a transparent adhesive 30 is injected into the shell body 15 after being mixed with the fluorescent powders 32. Furthermore, the fluorescent powders 32 can be overlaid on the second LED die 22 in a conformal layer manner. As shown in FIG. 1B, the first substrate 11 and second substrate 12 are isolated from each other by an S-shaped gap. In this regard, more space is available to the first LED die 21 and the second LED die 22 for a wire bonding process.

In comparison with FIGS. 1A-1B, FIGS. 2A-2B show a different wire bonding arrangement in a similar package structure. The first LED die 21 and second LED die 22 are connected to each other in series. To achieve such a series connection, a lead wire 23 is directly connected to the negative electrode of the second LED die 22 from the first LED die 21.

Figure 3A:
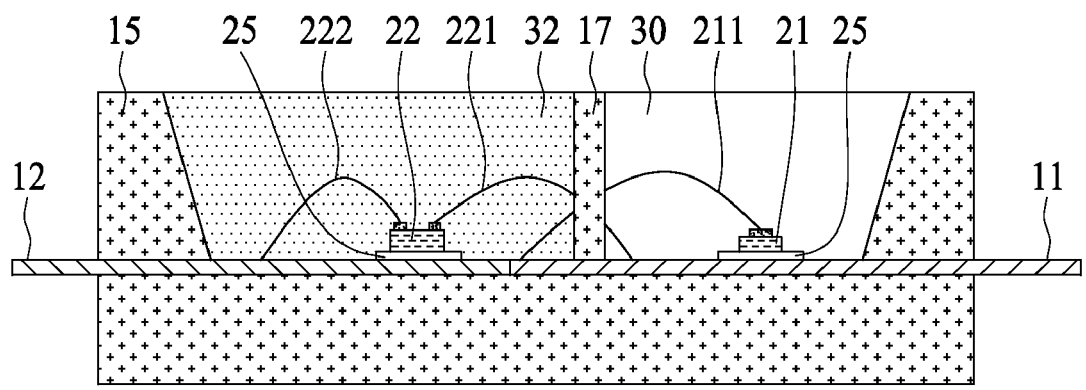
FIGS. 3A and 3B are diagrams showing a package structure of an LED device with a partition in accordance with the present invention.
Figure 3B:
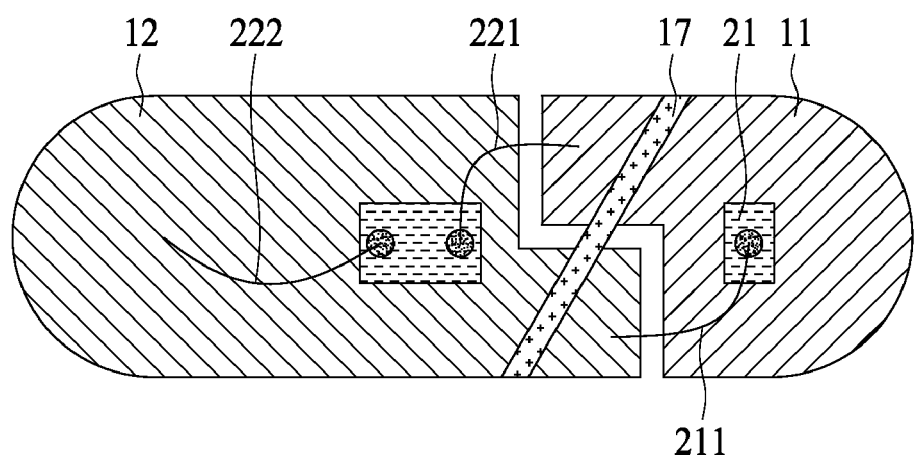

FIGS. 3A-3B show a package structure with a partition plate 17 separating the first LED die 21 and second LED die 22 from each other. If the shell body 15' is an injection-molded plastic part, the partition plate 17 can be integrated into the shell body 15' during an injection-molding process. If the shell body 15' is a ceramic part, the partition plate 17 can be integrated into the shell body 15' by using a high-temperature co-fired ceramics technology or low-temperature co-fired ceramics technology. Because the partition plate 17 divides the shell body 15' into two compartments, the fluorescent powders 32 are well mixed with the transparent adhesive 30 just above the second LED die 22 so that the light emitted from the excited fluorescent powders 32 is combined only with the light emitted from the short-wavelength second LED die 22. By contrast, only the transparent adhesive 30 is disposed above the first LED die 21. In this structure, because the fluorescent powders 32 do not block the light emitted from the first LED die 21, the effective light output of the first LED die 21 increases. The resulting light output increases by as much as 150%. A backlight source utilizing such an LED device can show sufficient strength of red light.

Figure 4A:
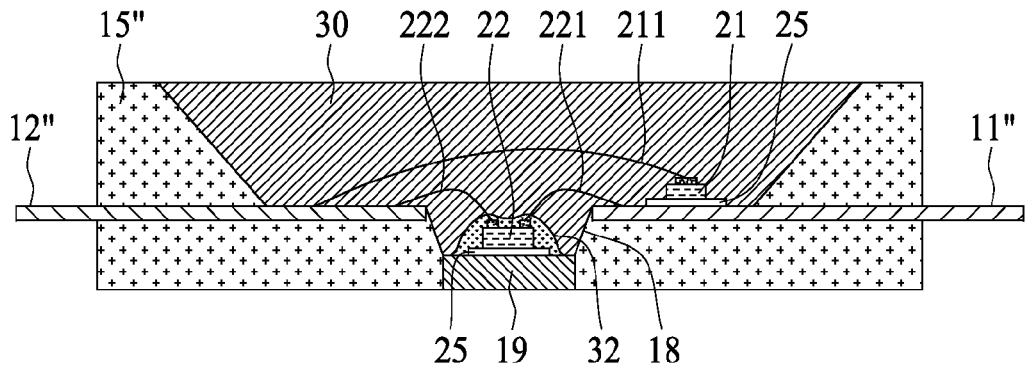
FIGS. 4A-4C are diagrams showing a down-set package structure of an LED device in accordance with another embodiment of the present invention.
Figure 4B:
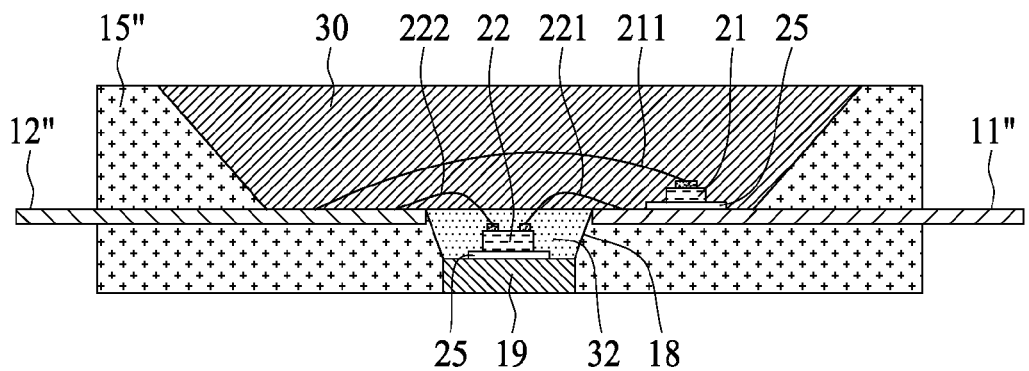
Figure 4C:
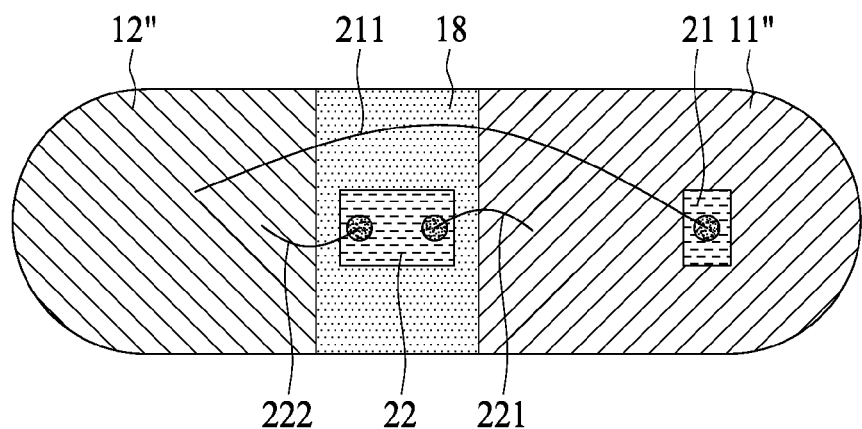

FIGS. 4A-4C show schematic diagrams of another embodiment of a package structure. The shell body 15" has two cavities acting as reflective areas. As shown in FIG. 4A, the short-wavelength LED die 22 is disposed in a down-set region 18 of the shell body 15", and is mounted on the shell body 15" by the die bonding adhesive 25. The fluorescent powders 32 are a conformal layer overlaid on the second LED die 22. The two electrodes of the second LED die 22 are connected to the first substrate 11" and second substrate 12" respectively by lead wires 221 and 222. In this embodiment, the surfaces of the first substrate 11" and second substrate 12" can be at the same level. The extension portions of the first substrate 11" and second substrate 12" out of the shell body can be bent in several ways to determine whether the package structure is a top-emitting type or a side-emitting type. A heat sink slug 19 is disposed under the second LED die 22 such that the heat generated from the second LED die 22 is dispersed outwards. For example, a heat sink can be adhered to the bottommost surface of the shell body 15". The first LED die 21 is mounted on the first substrate 11" by the die bonding adhesive 25. The electrode on the first LED die 21 is electrically connected to the second substrate 12" by a lead wire 211. The transparent adhesive 30 is dispensed into the inner of the shell body 15". As to another embodiment shown in FIG. 4B, the fluorescent powders 32 are well mixed with the transparent adhesive 30, and disposed in the cavity region 18 of second LED die 22. Apart from the locations of the fluorescent powders 32, the embodiments in FIGS. 4A and 4B are similar to each other. FIG. 4C is a top view of the package structure in FIG. 4A and FIG. 4B from which the upper shell body has been removed.

In view of above embodiments, the present invention partitions a package structure into two compartments for a long-wavelength LED die and a short-wavelength LED die respectively so that the long-wavelength LED die cannot absorb the light emitted from the short-wavelength LED die. Consequently, the light output of the package structure rises. Such a partitioned package structure is implemented by using a substrate with different levels or a partition plate disposed between the long-wavelength and short-wavelength LED dies. Furthermore, the light emitted from the long-wavelength LED die cannot be blocked by fluorescent powders and is more efficiently used in the light output of the package structure. The manufacturing processes of the package structure are compatible with present processes and are easily implemented by mass production. The light emitted from a long-wavelength LED die is not affected by the fluorescent powders so that the color rendering index of the package structure is increased. An LCD (Liquid Crystal Display) panel using such an LED device can display a larger quantity of colors.

The above-described embodiments of the present invention are intended to be illustrative only. Those skilled in the art may devise numerous alternative embodiments without departing from the scope of the following claims.

What is claimed is:

1. A package structure of a light emitting diode (LED) for a backlight, comprising:
   a shell body comprising a first cavity and a second cavity, wherein the second cavity is located in the first cavity;
   a first substrate and a second substrate located in the shell body, wherein an upper surface of the first substrate and an upper surface of the second substrate are substantially of the same height;
   a first LED die emitting light of a first wavelength and mounted on the first substrate;
   a second LED die emitting light of a second wavelength and disposed in the second cavity, wherein the first wavelength and the second wavelength are different and
   a mixture of fluorescent powders and a transparent adhesive disposed in the shell body.

2. The package structure of a light emitting diode for a backlight of claim 1, wherein the second wavelength is smaller than the first wavelength.

3. The package structure of a light emitting diode for a backlight of claim 1, further comprising a conformal layer including fluorescent powders overlaid on at least one of the first LED die and the second LED die.

4. The package structure of a light emitting diode for a backlight of claim 1, wherein the fluorescent powder is made of Yttrium Aluminum Garnet, Terbium Aluminum Garnet, silicate, sulfate, nitride or nitrogen oxide.

5. The package structure of a light emitting diode for a backlight of claim 1, wherein one of the first LED die and the second LED die is made of group III nitride and the other is made of group III nitride or group III phosphide.

6. The package structure of a light emitting diode for a backlight of claim 1, wherein the second LED die has at least one electrode connected to the first substrate or the second substrate.

7. The package structure of a light emitting diode for a backlight of claim 1, wherein the first LED die has at least one electrode electrically connected to the second substrate.

8. The package structure of a light emitting diode for a backlight of claim 1, further comprising a heat sink slug disposed in the second cavity and under the second LED die.

9. The package structure of a light emitting diode for a backlight of claim 8, wherein the second LED die is mounted on the heat sink slug.

10. The package structure of a light emitting diode for a backlight of claim 8, wherein each of the first substrate and the second substrate has an extension portion out of the shell body.

11. The package structure of a light emitting diode for a backlight of claim 8, further comprising a die bonding adhesive, wherein the second LED die is mounted on the heat sink slug by the die bonding adhesive.

12. The package structure of a light emitting diode for a backlight of claim 8, wherein the second LED die is mounted on the heat sink slug by flip-chip bonding.

13. A package structure of a light emitting diode (LED) for a backlight, comprising:
a shell body comprising a first cavity and a second cavity, wherein the second cavity is located in the first cavity;
a first substrate and a second substrate located in the shell body, wherein an upper surface of the first substrate and an upper surface of the second substrate are substantially of the same height;
a first LED die emitting light of a first wavelength and mounted on the first substrate;
a second LED die emitting light of a second wavelength and disposed in the second cavity, wherein the first wavelength and the second wavelength are different; and
a heat sink slug disposed in the second cavity and under the second LED die.

14. The package structure of a light emitting diode for a backlight of claim 13, wherein the second LED die is mounted on the heat sink slug.

15. The package structure of a light emitting diode for a backlight of claim 13, wherein each of the first substrate and the second substrate has an extension portion out of the shell body.

16. The package structure of a light emitting diode for a backlight of claim 13, further comprising a die bonding adhesive, wherein the second LED die is mounted on the heat sink slug by the die bonding adhesive.

17. The package structure of a light emitting diode for a backlight of claim 13, wherein the second LED die is mounted on the heat sink slug by flip-chip bonding.

18. A package structure of a light emitting diode (LED) for a backlight, comprising:
a shell body comprising a first cavity and a second cavity, wherein the second cavity is located in the first cavity;
a first substrate and a second substrate located in the shell body, wherein an upper surface of the first substrate and an upper surface of the second substrate are substantially of the same height;
a first LED die emitting light of a first wavelength and mounted on the first substrate; and
a second LED die emitting light of a second wavelength and disposed in the second cavity, the second wavelength being smaller than the first wavelength.

* * * * *